(12) United States Patent
Arikado et al.

(10) Patent No.: US 7,034,369 B2
(45) Date of Patent: Apr. 25, 2006

(54) SEMICONDUCTOR DEVICE AND METHOD FOR MANUFACTURING THE SAME

(75) Inventors: Tsunetoshi Arikado, Ibaraki-ken (JP); Takaaki Kawahara, Ibaraki-ken (JP); Kazuyoshi Torii, Ibaraki-ken (JP); Hiroshi Kitajima, Ibaraki-ken (JP); Seiichi Miyazaki, Hiroshima (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/913,551

(22) Filed: Aug. 9, 2004

(65) Prior Publication Data

US 2005/0045970 A1    Mar. 3, 2005

(30) Foreign Application Priority Data

Aug. 29, 2003    (JP) .............................. 2003-307147

(51) Int. Cl.
*H01L 29/76* (2006.01)
(52) U.S. Cl. ................... 257/411; 257/410; 257/310
(58) Field of Classification Search ................ 257/310, 257/410, 411, E29, 162; 438/240, 216, 281
See application file for complete search history.

(56) References Cited

U.S. PATENT DOCUMENTS

| | | | |
|---|---|---|---|
| 6,020,243 A | 2/2000 | Wallace et al. | |
| 6,291,867 B1 | 9/2001 | Wallace et al. | |
| 6,531,324 B1 * | 3/2003 | Hsu et al. .................... | 438/3 |
| 6,586,349 B1 | 7/2003 | Jeon et al. | |
| 6,674,138 B1 * | 1/2004 | Halliyal et al. ............. | 257/411 |
| 6,794,764 B1 * | 9/2004 | Kamal et al. ................ | 257/900 |
| 6,803,272 B1 * | 10/2004 | Halliyal et al. ............. | 438/240 |
| 6,812,514 B1 * | 11/2004 | Yang et al. .................. | 257/314 |
| 6,930,335 B1 * | 8/2005 | Yamaguchi et al. ........ | 257/288 |
| 6,949,433 B1 * | 9/2005 | Hidehiko et al. ........... | 438/261 |
| 2004/0198069 A1 * | 10/2004 | Metzner et al. ............. | 438/785 |

FOREIGN PATENT DOCUMENTS

JP    2004-031760    1/2004

OTHER PUBLICATIONS

Manchanda et al., "Si-Doped Aluminates for High Temperature Metal-Gate CMOS: Zr-Al-Si-O, A Novel Gate Dielectric for Low Power Applications", Dec. 10-13, 2000, pp. 23-26,Electron Devices Meeting, 2000. IEDM Technical Digest. International.*

(Continued)

*Primary Examiner*—Jerome Jackson
*Assistant Examiner*—Matthew C Landau
(74) *Attorney, Agent, or Firm*—Finnegan, Henderson, Farabow, Garrett & Dunner, L.L.P.

(57) ABSTRACT

A gate insulating film on a silicon substrate includes a $SiO_2$ film and a high-k film. The high-k film contains a transition metal, aluminum, silicon, and oxygen. The concentration of silicon in the high-k film is higher than the concentrations of the transition metal and aluminum in the vicinity of the interface with the $SiO_2$ film and the vicinity of the interface with the gate electrode. Furthermore, it is preferable that the concentration of silicon is the highest at least in one of the vicinity of the interface with the $SiO_2$ film or the vicinity of the interface with the gate electrode, gradually decreases with distance from these interfaces, and becomes the lowest in a central part of the high-k film.

15 Claims, 13 Drawing Sheets

OTHER PUBLICATIONS

Manchanda et al., "High K Dielectrics for the Silicon Industry", Nov. 1-2, 2001 Page(s):56-60, Gate Insulator, 2001. IWGI 2001. Extended Abstracts of International Workshop on □□.*

Yu et al., "Energy Gap and Band Alignment for $(HfO_2)_x (Al_2O_3)_{1-x}$ on (100) Si", *Proceedings of Applied Physics Letters*, 2002, vol. 81, No. 2, pp. 376-378.

Zhu et al., "$HfO_2$ and HfAlO for CMOS: Thermal Stability and Current Transport", *Proceedings of IEDM 01*, 2001, pp. 463-466.

Rotondaro et al., "Advanced CMOS Transistors With a Novel HfSiON Gate Dielectric", *Proceedings of 2002 Symposium On VLSI Technology Digest of Technical Papers*, pp. 148-149.

Inumiya et al., "Fabrication of HfSiON Gate Dielectrics by Plasma Oxidation and Nitridation, Optimized for 65 nm node Low Power CMOS Applications", *Proceedings of 2003 Symposium On VLSI Technology Digest of Technical Papers*, pp. 17-18.

Watanabe et al., "Design Guideline of HfSiON Gate Dielectrics for 65 nm CMOS Generation", *Proceedings of 2003 Symposium On VLSI Technology Digest of Technical Papers*, pp. 19-20.

Morioka et al., "High Mobility MISFET With Low Trapped Charge in HfSiO Films", *Proceedings of 2003 Symposium On VLSI Technology Digest of Technical Papers*, pp. 165-166.

* cited by examiner (* PDA 800°C 5s)

(* PDA 1000°C 1s)

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the same; and more specifically, to a semiconductor device that has a gate insulating film formed on a silicon substrate, and a gate electrode formed on the gate insulating film, and method for manufacturing such a semiconductor device.

2. Background Art

In recent years, the high integration in semiconductor integrated circuit devices has significantly proceeded, and in MOS (metal oxide semiconductor) devices, the miniaturization and raising the performance of elements, such as transistors) have been tried. Especially, the reduction of the thickness of a gate insulating film, which is one of elements composing the MOS structure, has rapidly proceeded to cope with the miniaturization, higher-speed and lower-voltage operation of transistors.

As a material for composing a gate insulating film, a $SiO_2$ (silicon dioxide) film has conventionally been used. On the other hand, as the thickness of the gate insulating film has been reduced concurrent with the miniaturization of the gate electrode, tunnel current, or gate leakage current, caused by the direct tunneling of carriers (electrons and holes) through the gate insulating film will increase. For example, ITRS (International Technology Roadmap for Semiconductors) requires that a gate insulating film has a silicon-dioxide-film-converted thickness (or EOT (equivalent oxide thickness)) of 1.2 nm to 1.6 nm by 2007, which is considered to be the 65-nm generation). However, since gate leakage current caused by tunnel current will exceed the acceptable value when a $SiO_2$ film is used, the adoption of a new material that can substitute the $SiO_2$ film will be required.

Therefore, the use of a material having a higher specific dielectric constant that can substitute for the $SiO_2$ film has been studied. The examples of presently noticeable insulating films having high dielectric constants (hereafter referred to as high-k films) include a $HfO_2$ (hafnium dioxide) film, a $HfAlO_x$ (hafnium aluminate) film and a $HfSiO_x$ (hafnium silicate) film (refer to Patent References 1 and 2, and Non-Patent References 1 to 6).

[Patent Document 1]
U.S. Pat. No. 6,291,867 B1

[Patent Document 2]
U.S. Pat. No. 6,020,243

[Non-Patent Document 1]
H. Y. Yu et al., Applied Physics Letters, (US), 2002, Vo. 81, No. 2, pp. 376–378

[Non-Patent Document 2]
W. Zhu et al., Technology Digest of IEDM, 2001, pp. 463–466

[Non-Patent Document 3]
A. L. P. Rotondaro et al., Technology Digest of 2002 Symposium on VLSI Technology, 2002, pp. 148–149

[Non-Patent Document 4]
S. Inumiya et al., Technology Digest of 2003 Symposium on VLSI Technology, 2003, pp. 17–18

[Non-Patent Document 5]
T. Watanabe et al., Technology Digest of 2003 Symposium on VLSI Technology, 2003, pp. 19–20

[Non-Patent Document 6]
A. Morioka et al., Technology Digest of 2003 Symposium on VLSI Technology, 2003, pp. 165–166

In the above-described high-k films, the $HfO_2$ film has a high specific dielectric constant. However, since $HfO_2$ has poor heat resistance, there has been a problem of crystallization during the manufacture of a CMOS (complementary MOS), causing increase in leakage current and lowering the reliability of elements. On the other hand, since $HfAlO_x$ and $HfSiO_x$ have higher crystallizing temperatures, the above-described problem can be solved.

When the specific dielectric constants of $SiO_2$ and $Al_2O_3$ are compared, that of $SiO_2$ is about 4, while that of $Al_2O_3$ is about 9. Therefore, when the content of Hf is constant, the $HfAlO_x$ film has a higher specific dielectric constant than the $HfSiO_x$ film. For this reason, when the physical thicknesses of these films are same, the equivalent oxide thickness of the $HfAlO_x$ film can be reduced compared with the $HfSiO_x$ film. However, there has been a problem in the $HfAlO_x$ film that when the film thickness is reduced, the film quality is lowered.

On the other hand, the carrier mobility and the ON-current value in the transistor using the $HfSiO_x$ film is larger than those in the transistor using the $HfAlO_x$ film. The hysteresis observed in the capacity-voltage curve of a transistor using the $HfSiO_x$ film is smaller than that in the transistor using the $HfAlO_x$ film. Therefore, the trap of electrons in the boundary and the film in the $HfSiO_x$ film is less. However, as described above, since the $HfSiO_x$ film has a lower specific dielectric constant than the $HfAlO_x$ film, there has been a problem that the equivalent oxide thickness cannot be reduced.

SUMMARY OF THE INVENTION

The present invention has been devised to solve such problems. Specifically, it is an object of the present invention to provide a semiconductor device having a gate insulating film that can minimize both hysteresis and equivalent oxide thickness, and a method for manufacturing such a semiconductor device.

According to one aspect of the present invention, a semiconductor device comprises a gate insulating film formed on a silicon substrate, and a gate electrode formed on the gate insulating film. The gate insulating film comprises an oxide film containing silicon, and a high-dielectric-constant film formed on the oxide film containing silicon. The high-dielectric-constant film is a film containing a transition metal, aluminum, silicon and oxygen. The concentration of the silicon in the high-dielectric-constant film is larger than the concentration of the transition metal and the aluminum in the vicinity of the boundary with the oxide film containing silicon and in the vicinity of the boundary with the gate electrode.

According to another aspect of the present invention, a semiconductor device comprises a gate insulating film formed on a silicon substrate, and a gate electrode formed on the gate insulating film. The gate insulating film is a high-dielectric-constant film containing a transition metal, aluminum, silicon and oxygen. The concentration of the silicon is larger than the concentration of the transition metal and the aluminum in the vicinity of the boundary with the silicon substrate and in the vicinity of the boundary with the gate electrode.

According to other aspect of the present invention, in a method for manufacturing a semiconductor device, a $SiO_2$ film is formed on a silicon substrate. A $HfAlSiO_x$ film is formed on the $SiO_2$ film. A gate electrode composed of polysilicon is formed on the $HfAlSiO_x$ film. The step of forming the $HfAlSiO_x$ film is a step using an ALD method using $Hfcl_4$, $Al(CH_3)_3$, $Si(OC_2H_5)_4$, and an oxidizing gas as materials. The concentration of silicon in the $HfAlSiO_x$ film is made larger than the concentration of hafnium and aluminum in the vicinity of the boundary with the $SiO_2$ film and in the vicinity of the boundary with the gate electrode by changing the time of supplying each of $HfCl_4$, $Al(CH_3)_3$, and $Si(OC_2H_5)_4$.

According to other aspect of the present invention, in a method for manufacturing a semiconductor device, a $HfAlSiO_x$ film is formed on a silicon substrate. A gate electrode composed of polysilicon is formed on the $HfAlSiO_x$ film. The step of forming the $HfAlSiO_x$ film is a step using an ALD method using $HfCl_4$, $Al(CH_3)_3$, $Si(OC_2H_5)_4$, and an oxidizing gas as materials. The concentration of silicon in the $HfAlSiO_x$ film is made larger than the concentration of hafnium and aluminum in the vicinity of the boundary with the silicon substrate and in the vicinity of the boundary with the gate electrode by changing the time of supplying each of $HfCl_4$, $Al(CH_3)_3$, and $Si(OC_2H_5)_4$.

Other and further objects, features and advantages of the invention will appear more fully from the following description.

DETAILED DESCRIPTION OF THE PREFERRED EMBODIMENTS

Figure 1:
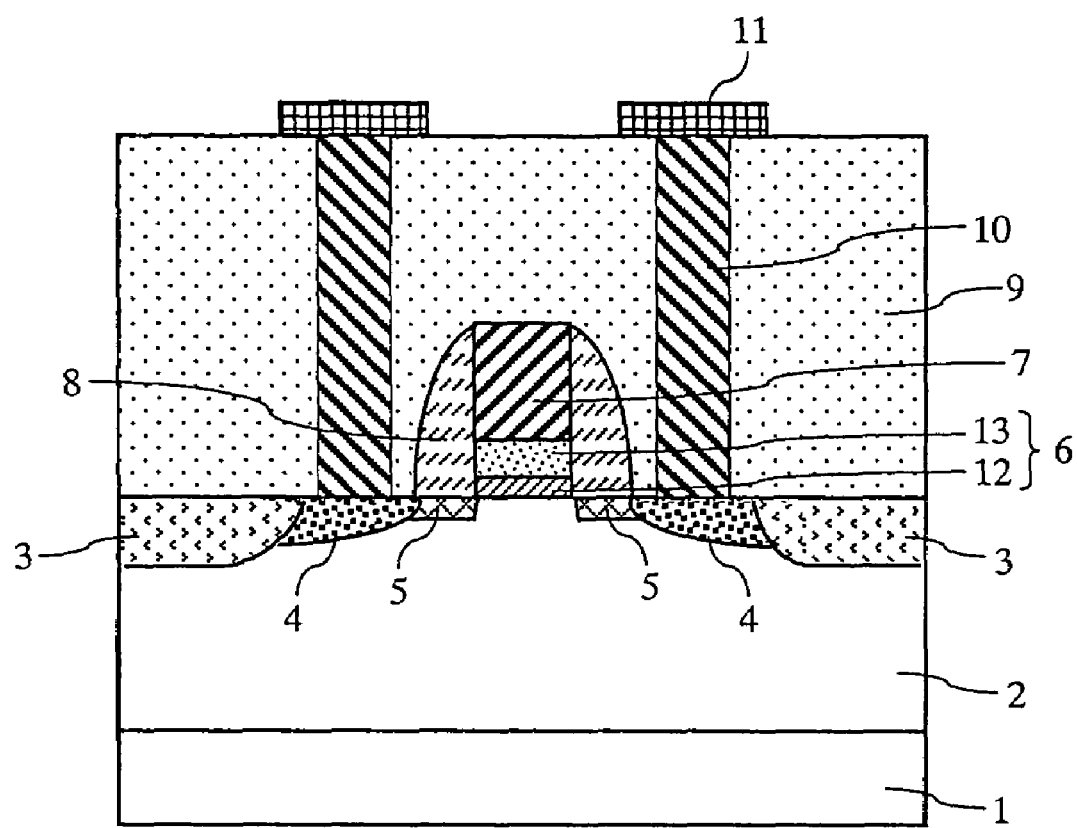
FIG. 1 is a cross-sectional view of a semiconductor device according to the present invention.

FIG. 1 is an example of a sectional view of a semiconductor device according to an embodiment of the present invention.

As FIG. 1 shows, a diffusion layer 2, element-isolating regions 3, source-drain regions 4, and an extension region 5 are formed on a silicon substrate 1. A gate insulating film 6 and a gate electrode 7 are also formed on the silicon substrate 1, and a sidewall 8 is formed on the sides of the gate insulating film 6 and the gate electrode 7. In FIG. 1, the reference numeral 9 denotes an interlayer insulating film, 10 denotes contacts, and 11 denotes wiring layers.

The gate insulating film 6 is composed of a $SiO_2$ film (silicon dioxide film) 12 and a high-k film (high-dielectric-constant film) 13 formed on the $SiO_2$ film 12.

In this embodiment, a dielectric film containing a transition metal, aluminum (Al), silicon (Si) and oxygen (O). It is especially preferred to use a dielectric film consisting of the mixture of an aluminate and a silicate of a transition metal as the high-k film 13. The transition metal is preferably an element in the group IV of the periodic table, and more preferably Hf (hafnium). For example, a $HfAlSiO_x$ film can be used as the high-k film 13.

This embodiment is also characterized in that the concentration of silicon in the high-k film 13 is higher than the concentrations of the transition metal and aluminum in the vicinity of the boundary with the $SiO_2$ film 12 and in the vicinity of the boundary with the gate electrode 7. In particular, it is preferred that the concentration of silicon is the highest at least in either one of the vicinity of the boundary with the $SiO_2$ film 12 or the vicinity of the boundary with the gate electrode 7, gradually decreases as parting from these boundaries, and becomes the lowest in the vicinity of the center of the high-k film 13.

A method for manufacturing a semiconductor device according to this embodiment will be described referring to FIGS. 2 to 10. In these drawings, the parts denoted by the same reference numerals in FIG. 1 are the same parts.

Figure 2:
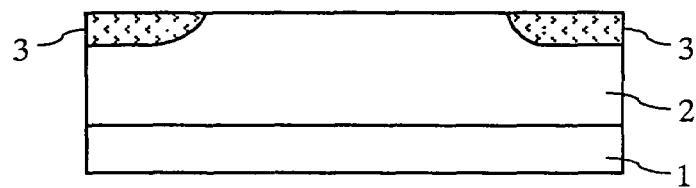
FIG. 2 is a cross-sectional view illustrating a method for manufacturing a semiconductor device according to the present invention.

First, as FIG. 2 shows, a silicon dioxide film is buried in the predetermined regions of the silicon substrate 1 to form element-isolating regions 3 of an STI (shallow trench isolation) structure.

Next, a diffusion layer 2 is formed on the silicon substrate 1 using a photolithography method (FIG. 2). For example, a resist pattern (not shown) is formed on a predetermined region, and using this resist pattern as a mask, an N-type or a P-type impurity is implanted in the silicon substrate 1. Thereafter, the impurity is diffused using heat treatment to form an N-type diffusion layer of a P-type diffusion layer.

Figure 3:
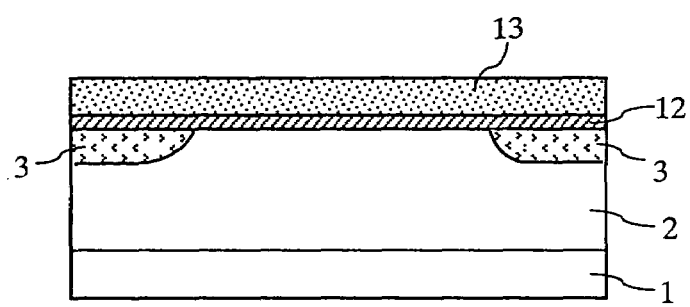
FIG. 3 is a cross-sectional view illustrating a method for manufacturing a semiconductor device according to the present invention.

Next, as FIG. 3 shows, a $SiO_2$ film 12 is formed on the surface of the silicon substrate 1. The $SiO_2$ film 12 can be formed by the thermal oxidation method, for example.

In this embodiment, a silicon-containing oxide film other than the $SiO_2$ film may also be used. For example, a SiON film (silicon oxynitride film) can also be used. Furthermore, in this embodiment, the silicon-containing oxide film may be a laminated film of two or more oxides. For example, the silicon-containing oxide film may be a laminated film composed of a SiON film and a $SiO_2$ film. In this case, the $SiO_2$ film may be formed on the SiON film, or the SiON film may be formed on the $SiO_2$ film.

Next, a high-k film 13 is formed on the $SiO_2$ film 12. The high-k film 13 can be formed using an ALD (atomic layer deposition) method, a CVD (chemical vapor deposition) method, or a sputtering method. In particular, the ALD method can be preferably used because a film having an extremely even thickness and composition can be grown, and the material design at the atomic layer level can be easily performed. A method for forming a $HfAlSiO_x$ film using an ALD method will be described below.

First, a substrate after the completion of the formation of the $SiO_2$ film 12 is placed in a vacuum chamber of a film-forming apparatus.

Next, $HfCl_4$ (hafnium tetrachloride) to be a material is intermittently (in pulse) supplied onto the surface of a substrate (Step 1). Thereafter, water vapor ($H_2O$) as an oxidizing gas is intermittently supplied (Step 2). Next, $Al(CH_3)_3$ (trimethyl aluminum) as a material is intermittently supplied (Step 3). Again, water vapor is intermittently supplied (Step 4). Then, $Si(OC_2H_5)_4$ (tetraethoxysilane) as a material is intermittently supplied (Step 5). Finally, water vapor is intermittently supplied (Step 6).

The above cycle of Steps 1 through 6 is repeated several times to form a desired $HfAlSiO_x$ film. The number of cycles can be adequately decided depending to the film thickness. In the above steps, the time of supplying $HfCl_4$ can be fixed, and the time of supplying $Al(CH_3)_3$ and $Si(OC_2H_5)_4$ can be changed to vary the contents of Al and Si in the $HfAlSiO_x$ film.

Figure 11:
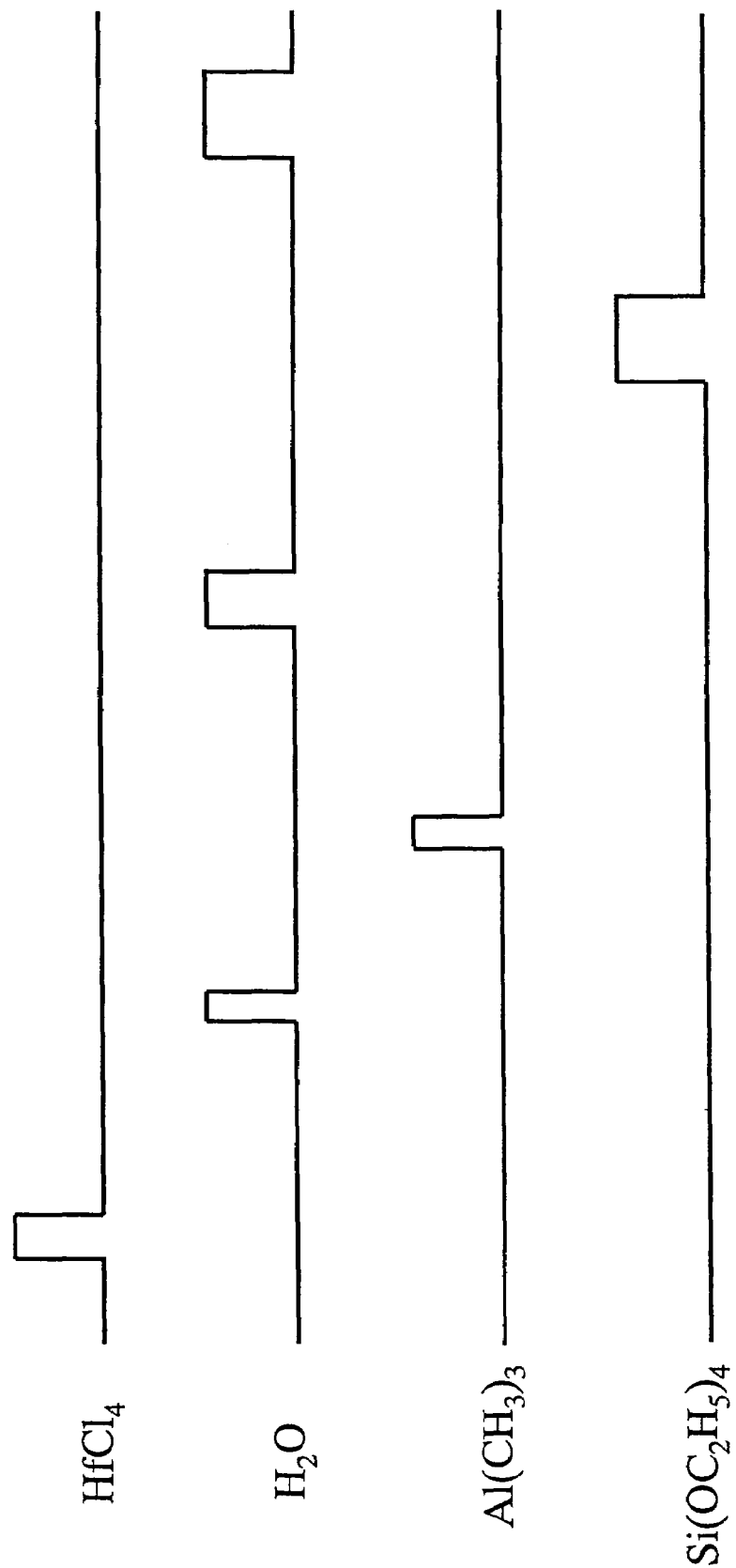
FIG. 11 shows a sequence of a supply of gases according to the present invention.

As an example, a substrate on which a $SiO_2$ film 12 was placed in a sheet-fed CVD apparatus, and the surface temperature of the substrate was maintained at 300° C. Then, $N_2$ (nitrogen) gas was flowed, and the total pressure in the film-forming chamber was controlled to be 0.2 torr. Next, $HfCl_4$ was supplied onto the surface of the substrate for 1.5 seconds. Five seconds after, water vapor was supplied for 1 second. Further, 4 seconds after, $Al(CH_3)_3$ was supplied for 1.2 seconds. Further, 6 seconds after, water vapor was supplied for 2 seconds, and another 5 seconds after, $Si(OC_2H_5)_4$ was supplied for 3 seconds. Finally, 4 seconds after, water vapor was supplied for 3 seconds. The above sequence is shown in FIG. 11.

Figure 12:
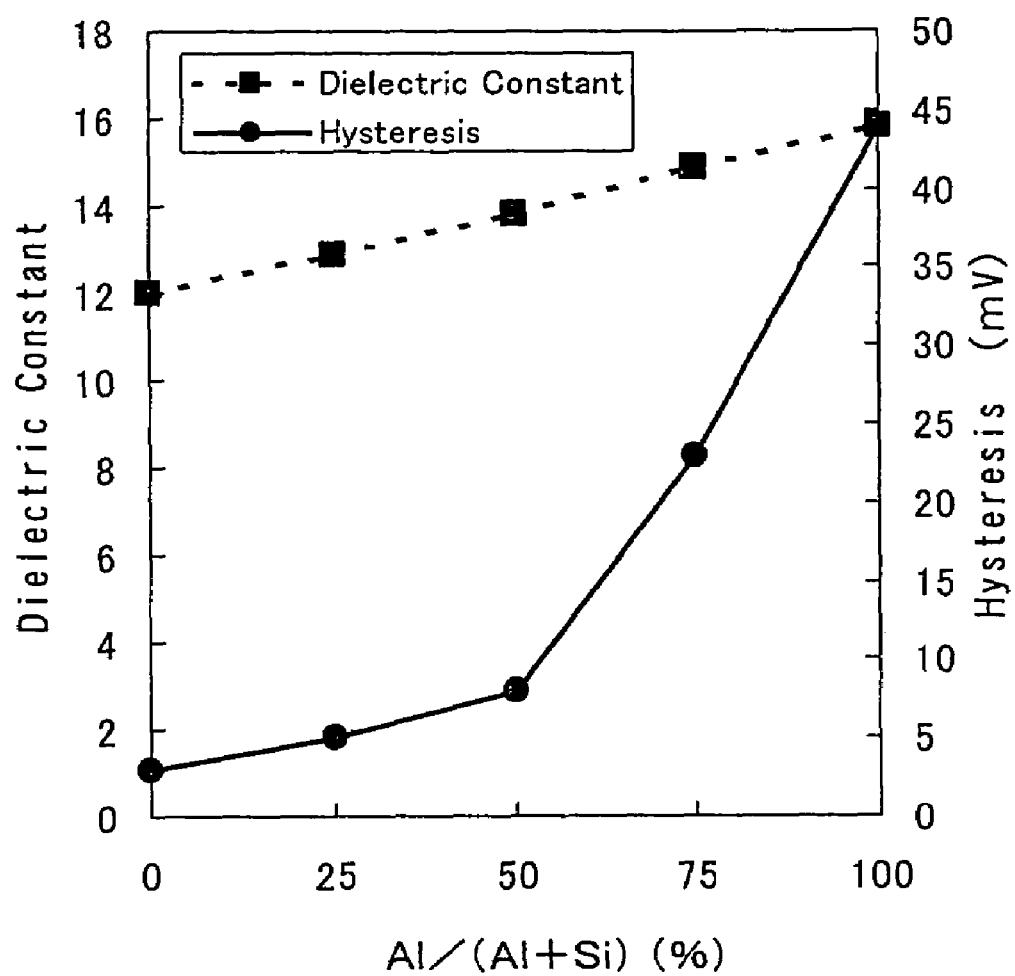
FIG. 12 is shows the relationship of quantity of Al in a HfAlSiOx film to specific dielectric constant and hysteresis.

FIG. 12 shows the relationship of the quantity of Al in the $HfAlSiO_x$ film to the specific dielectric constant and the hysteresis. In the example of FIG. 12, for the metallic elements in the $HfAlSiO_x$, the quantity of Hf was fixed at 30%, and the Al/Si ratio was varied within the range of remaining 70% to vary the quantity of Al. A capacitor, formed by forming an Al electrode using a sputtering method on the $HfAlSiO_x$ film formed in the above example, was used as a sample. Furthermore, the capacity of the obtained capacitor was measured, and the hysteresis was obtained for the capacity-voltage curve.

As can be seen from FIG. 12, the specific dielectric constant increases flatly with increase in the content of Al. Therefore, when the physical thickness is identical, films of thinner equivalent silicon oxide thickness can be formed as the content of Al is higher. On the other hand, although the hysteresis increases with increase in the content of Al, the gradient is not flat. Specifically, the increment is small until the content of Al reaches about 50%, and increases when the content of Al exceeds 50%.

As a high-k film, a film having a thin equivalent silicon oxide thickness and a small hysteresis is preferable. Therefore, a preferable high-k film can be formed when the content of Al is within a range of 50% or less, especially about 50% in FIG. 12. In other words, it is preferable that the contents of Hf, Al, and Si in the $HfAlSiO_x$ film are about 30%, about 35%, and about 35%, respectively. However, the content of Hf is not limited to 30%, but can be changed within a range between 25% and 35%. Therefore, a film with a thin equivalent oxide thickness and a small hysteresis can be formed when the contents of Hf, Al, and Si in the $HfAlSiO_x$ film are 25% to 35.0%, 32.5% to 37.5%, and 32.5% to 37.5%, respectively.

Furthermore, in this embodiment, Si in the high-k film is made to have the concentration distribution in the film thickness direction. Specifically, the concentration of Si in the vicinities of the lower and upper boundaries in the film thickness direction is made to be high, and the concentration of Si in the vicinity of the center is made to be low. At this time, the concentration of Si in the vicinities of the lower and upper boundaries is made to be higher than the concentrations of Hf and Al. Specifically, it is preferred that the concentration of Si is highest in the vicinities of the boundaries, gradually decreases as parting from the boundaries, and becomes lowest in the vicinity of the center.

On the other hand, the concentrations of Hf and Al may have any distribution as long as the concentrations in the vicinities of the boundaries are lower than the concentration of Si. For example, each of Hf and Al may have an even concentration.

In MOS semiconductor elements, since a high current driving force is required as well as the control of leakage current, the mobility must be increased. Therefore, it is preferred to lower the interfacial level density of the high-k film 13 to suppress the lowering of the mobility If the concentrations of Hf and Al are high in the vicinity of the lower boundary of the high-k film 13, namely in the vicinity of the boundary with the $SiO_2$ film 12, the interfacial level density elevates. Therefore, by elevating the concentration of Si in the vicinity of the lower boundary, the interfacial level density can be lowered.

If the concentration of Hf is high in the vicinity of the upper boundary of the high-k film 13, namely in the vicinity of the boundary with the gate electrode 7, the dopant in the polysilicon film that composes the gate electrode 7 bonds to Hf, and the value of the threshold voltage $V_{th}$ shifts to the direction wherein the absolute value thereof increases. If the concentration of Al is high, the value of $V_{th}$ shifts in the similar manner. Therefore, the shift of $V_{th}$ can be suppressed by increasing the concentration of Si in the vicinity of the upper boundary.

According to this embodiment, as described above, a gate insulating film with a thin equivalent oxide thickness and a small hysteresis can be formed by the use of a $HfAlSiO_x$ film as the high-k film 13. In this case, the contents of Hf, Al, and Si in the $HfAlSiO_x$ film are preferably 25% to 35.0%, 32.5% to 37.5%, and 32.5% to 37.5%, respectively.

Also according to this embodiment, the interfacial level density can be reduced and the shift of $V_{th}$ can be suppressed by making the content of Si in the high-k film 13 distribute to be higher than the contents of Al and Hf in the vicinity of the boundary with the $SiO_2$ film 12 and in the vicinity of the boundary with the gate electrode 7. Such concentration distribution can be achieved, for example, by changing the supplying time of each of $HfCl_4$, $Al(CH_3)_3$, and $Si(OC_2H_5)_4$, which are the materials of the high-k film 13.

After forming the high-k film 13, it is preferred to reform the high-k film 13 by performing PDA (post deposition annealing), which is a high-temperature heat treatment. Thereby, the quantity of hydrogen derived from the impurity contained in the high-k film 13 can be reduced to about one-tenth. In general, C (carbon) as an impurity is easily adsorbed on the surface of the high-k film 13. However, such an impurity can also be removed by performing PDA.

Next, a polysilicon film 14, which is the material of the gate electrode, is formed on the high-k film 13. The polysilicon film 14 can be formed, for example, by using a CVD method.

Figure 4:
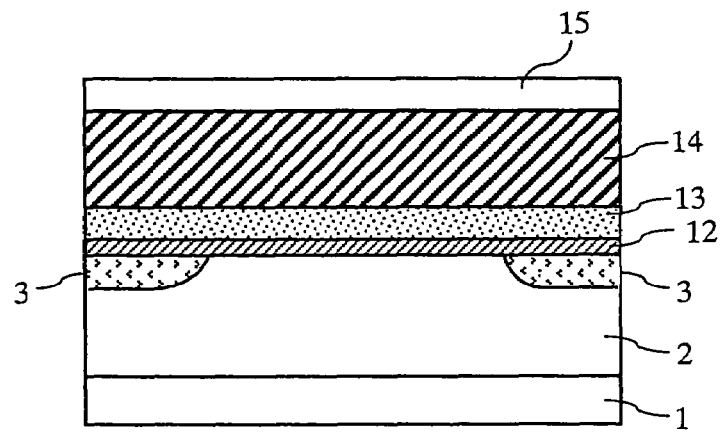
FIG. 4 is a cross-sectional view illustrating a method for manufacturing a semiconductor device according to the present invention.

After the polysilicon film 14 has been formed, a $SiO_2$ film 15 is formed thereon as the material of the hard mask (FIG. 4).

After forming the $SiO_2$ film 15, an antireflective film (not shown) may be formed thereon. The antireflective film plays a role to eliminate the reflection of the exposing light at the boundary between the resist film and the antireflective film by absorbing the exposing light transmitted through the resist film when the resist film is patterned. As the antireflective film, a film consisting mainly of an organic compound formed, for example, by spin coating can be used.

Figure 5:
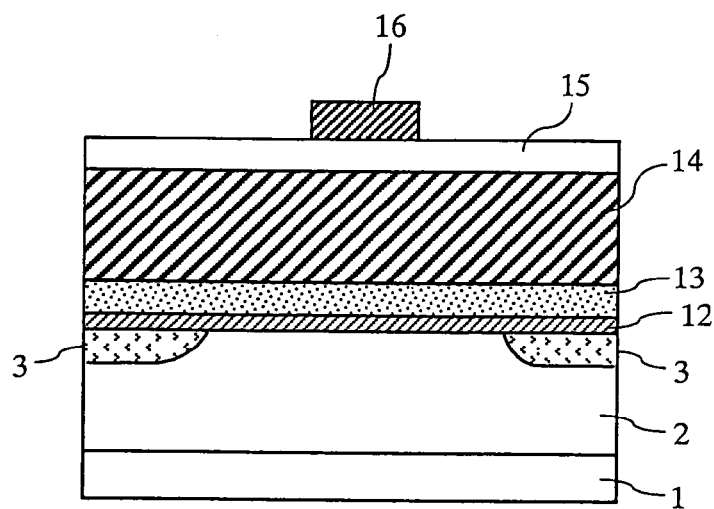
FIG. 5 is a cross-sectional view illustrating a method for manufacturing a semiconductor device according to the present invention.

Next, a resist film (not shown) is formed on the $SiO_2$ film 15, and a resist pattern 16 having a desired line width is formed using a photolithography method to form the structure shown in FIG. 5.

Figure 6:
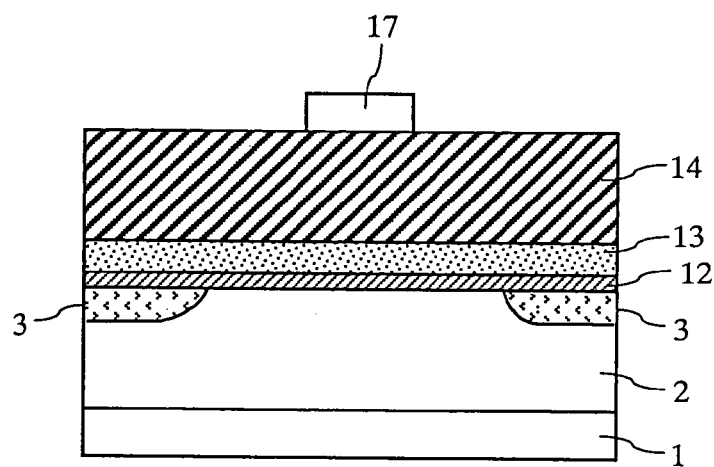
FIG. 6 is a cross-sectional view illustrating a method for manufacturing a semiconductor device according to the present invention.

Next, the $SiO_2$ film 15 is subjected to dry etching using the resist pattern 16 as the mask. Thereafter, the resist pattern 16 that has become unnecessary is removed to form a $SiO_2$ film pattern 17 as a hard mask as FIG. 6 shows.

Next, the polysilicon film 14 is subjected to dry etching using the $SiO_2$ film pattern 17 as the mask. As the etching gas, at least one selected from a group consisting of, for example, $BCl_3$, $Cl_2$, HBr, $CF_4$, $O_2$, Ar, $N_2$ and He can be used.

Figure 7:
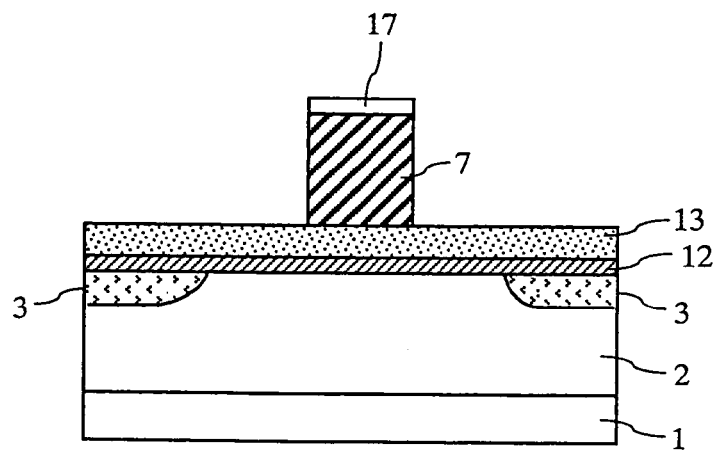
FIG. 7 is a cross-sectional view illustrating a method for manufacturing a semiconductor device according to the present invention.

FIG. 7 shows the state after the polysilicon film 14 has been subjected to dry etching. As FIG. 7 shows, the gate electrode 7 is formed by the dry etching of the polysilicon film 14.

Figure 8:
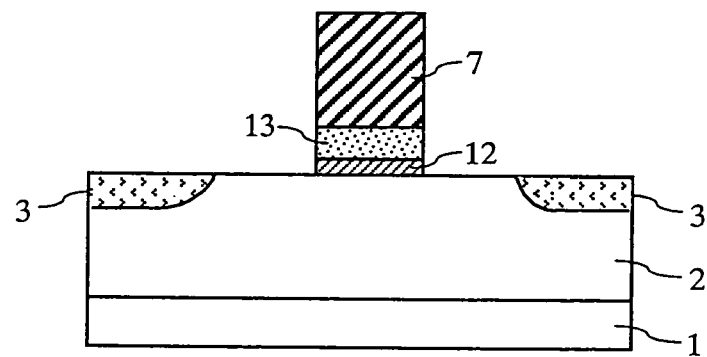
FIG. 8 is a cross-sectional view illustrating a method for manufacturing a semiconductor device according to the present invention.

Next, the high-k film 13 and the $SiO_2$ film 12 are etched using the $SiO_2$ film pattern 17 as the mask. Thereby, the structure shown in FIG. 8 is obtained. In FIG. 8, the high-k film 13 and the $SiO_2$ film 12 after patterning form the gate insulating film 6.

Next, after the ion implantation of an impurity into the diffused layer 2 in the silicon substrate 1 using the gate electrode 7 as the mask, activation is performed by heat treatment to form the extension region 5.

Figure 9:
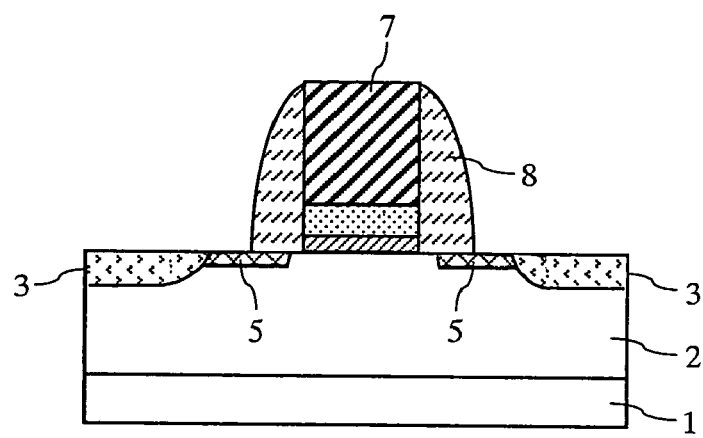
FIG. 9 is a cross-sectional view illustrating a method for manufacturing a semiconductor device according to the present invention.

A sidewall 8 is formed using a method known to the art to form the structure shown in FIG. 9. At this time, the sidewall 8 is made to be the sidewall of the gate electrode 7 and the gate insulating film 6.

Figure 10:
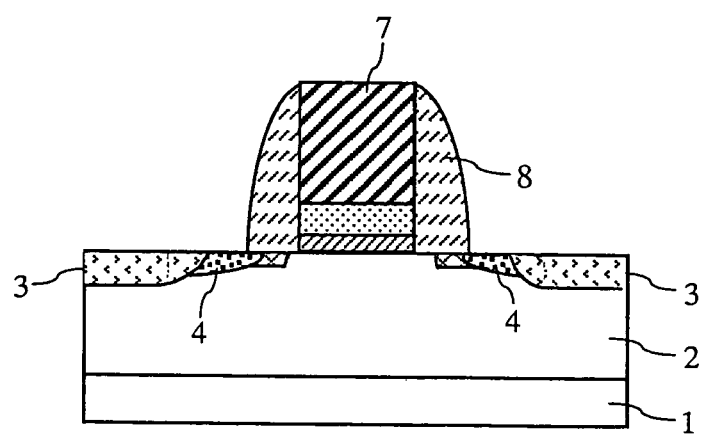
FIG. 10 is a cross-sectional view illustrating a method for manufacturing a semiconductor device according to the present invention.

Next, the ion implantation of an impurity is performed into the diffused layer 2 in the silicon substrate 1. Then, activation is performed by heat treatment to form source-drain regions 4 (FIG. 10). Thereafter, an interlayer insulating film 9, contacts 10 and wirings 11 are formed to obtain the structure shown in FIG. 1.

According to this embodiment, a semiconductor device having a thin gate insulating film with a small hysteresis can be formed by the use of a dielectric film containing a transition metal, aluminum, silicon and oxygen as the high-k film.

Also according to this embodiment, by making the concentration of silicon in the high-k film distribute so as to be higher than the concentrations of aluminum and the transition metal in the vicinity of the boundary with the silicon-containing oxide film and in the vicinity of the boundary with the gate electrode, the interfacial level density can be lowered, and the shift of $V_{th}$ can be suppressed.

In this embodiment, although a film composed of a silicon-containing oxide film and a high-k film formed thereon is used as the gate insulating film, the present invention is not limited thereto. For example, a high-k film may be formed directly on the silicon substrate, and the film composed of only the high-k film may be used as the gate insulating film. In this case, the concentration of silicon is made to be higher than the concentrations of transition metal and the aluminum in the vicinity of the boundary with the silicon substrate and in the vicinity of the boundary with the gate electrode. Furthermore, it is preferred that the concentration of silicon is highest in the vicinity of the boundary with the silicon substrate and in the vicinity of the boundary with the gate electrode, gradually decreases as parting from the boundaries, and becomes lowest in the vicinity of the center of the high-k film.

Also in this embodiment, although an example wherein a polysilicon film is used as the material of the gate electrode is described, the present invention is not limited thereto. A silicon-containing film, such as an amorphous silicon film and a silicon-germanium film, can also be used. A gate electrode having a multi-layer structure, wherein a polysilicon film, an amorphous silicon film or a silicon-germanium film, may also be used.

Figure 13:
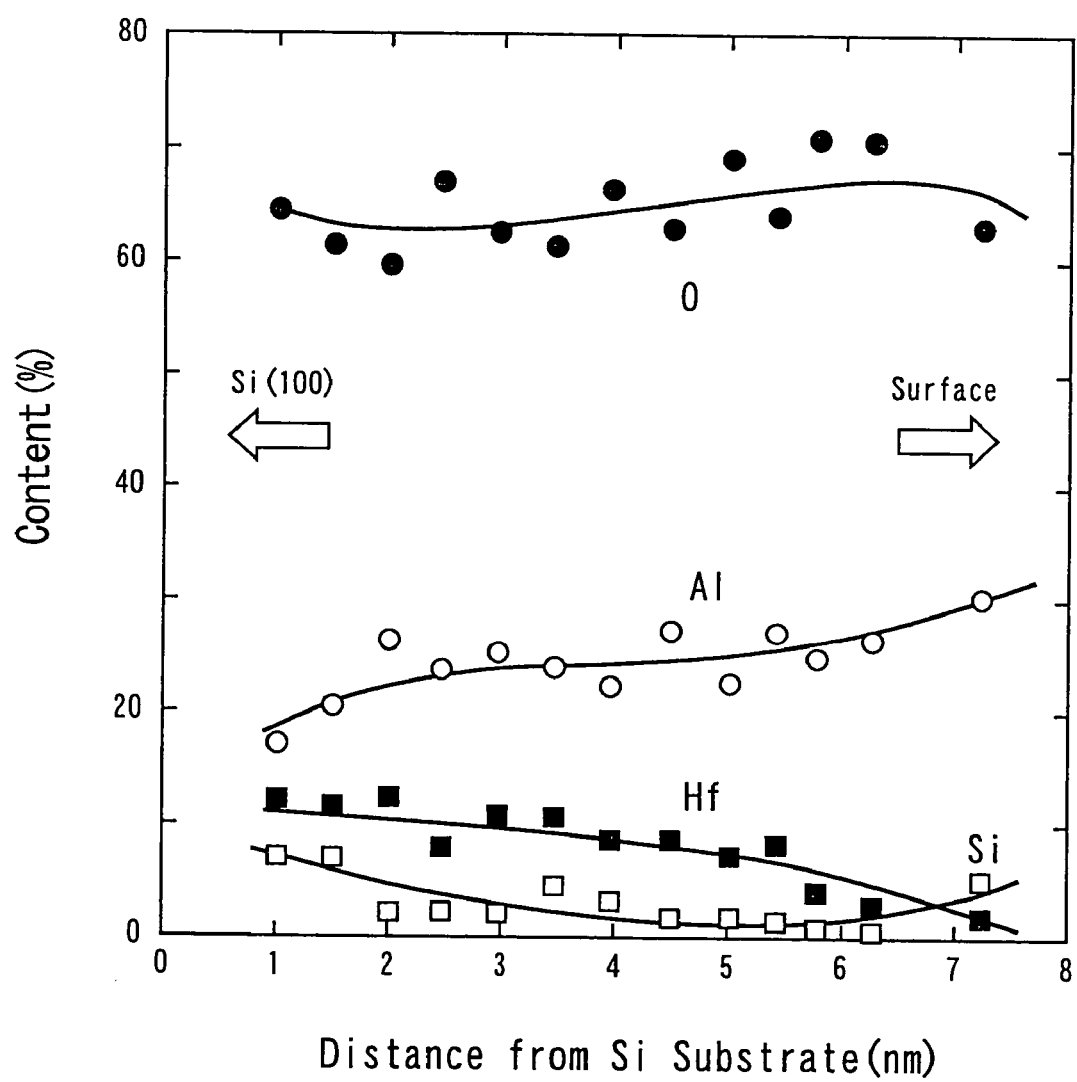
FIG. 13 is a graph showing change in composition distribution in a HfAlOx film against the distance from a silicon substrate.

FIG. 13 is a graph showing change in the composition distribution in a $HfAlO_x$ film against the distance from the silicon substrate, in a sample prepared by laminating a $SiO_2$ film and a $HfAlO_x$ film in this order, and performing PDA. An XPS (X-ray photoelectron spectroscopy) was used for the measurement, and while peeling the surface off the $HfAlO_x$ film using a diluted hydrofluoric acid solution, the proportions of elements present on the outermost surface thereof were obtained.

It is seen from FIG. 13 that hydrogen and carbon in the $HfAlO_x$ film are outwardly diffused into the gas phase by PDA. It is also seen that Si is diffused from the underlying $SiO_2$ film into the $HfAlO_x$ film, while Hf and Al are diffused from the $HfAlO_x$ film into the $SiO_2$ film. Here, the concentration of Si is high in the vicinity of the $SiO_2$ film and on the outermost surface of the $HfAlO_x$ film.

Figure 14:
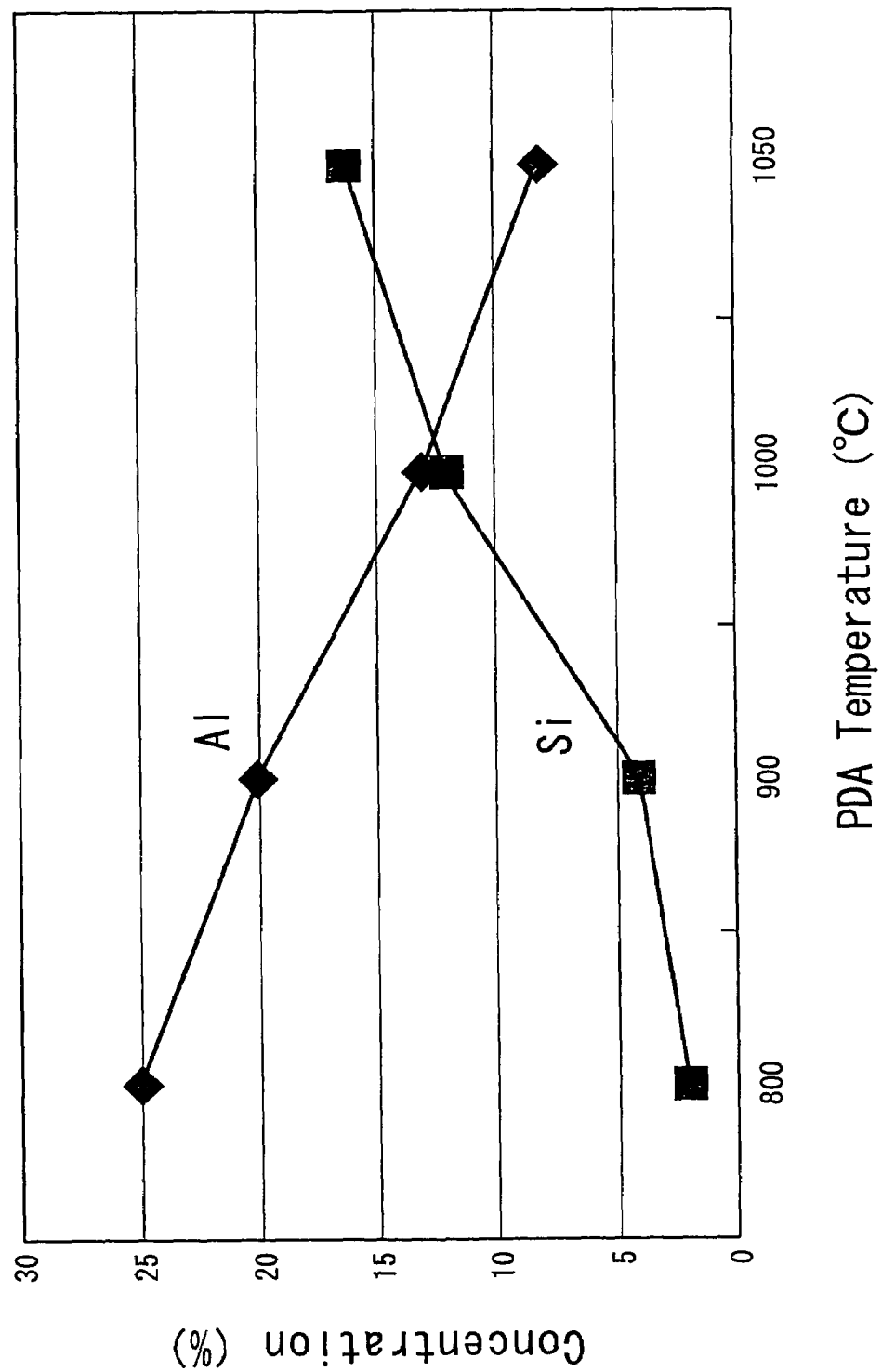
FIG. 14 is a graph showing change in the average concentrations of Si and Al in the HfAlOx film with change in PDA temperatures.

FIG. 14 is a graph showing change in the average concentrations of Si and Al in the $HfAlO_x$ film with change in PDA temperatures. The same sample as the sample in FIG. 13 was used for the measurement.

It is seen from FIG. 14 that the quantity of Si diffused into the $HfAlO_x$ film increases as PDA temperatures is high, while the quantity of Al present in the $HfAlO_x$ film decreases. At the PDA temperature of 1000° C., the concentration of Si substantially equals to the concentration of Al, and at 1050° C., the concentration of Si becomes higher than the concentration of Al.

Figure 15A:
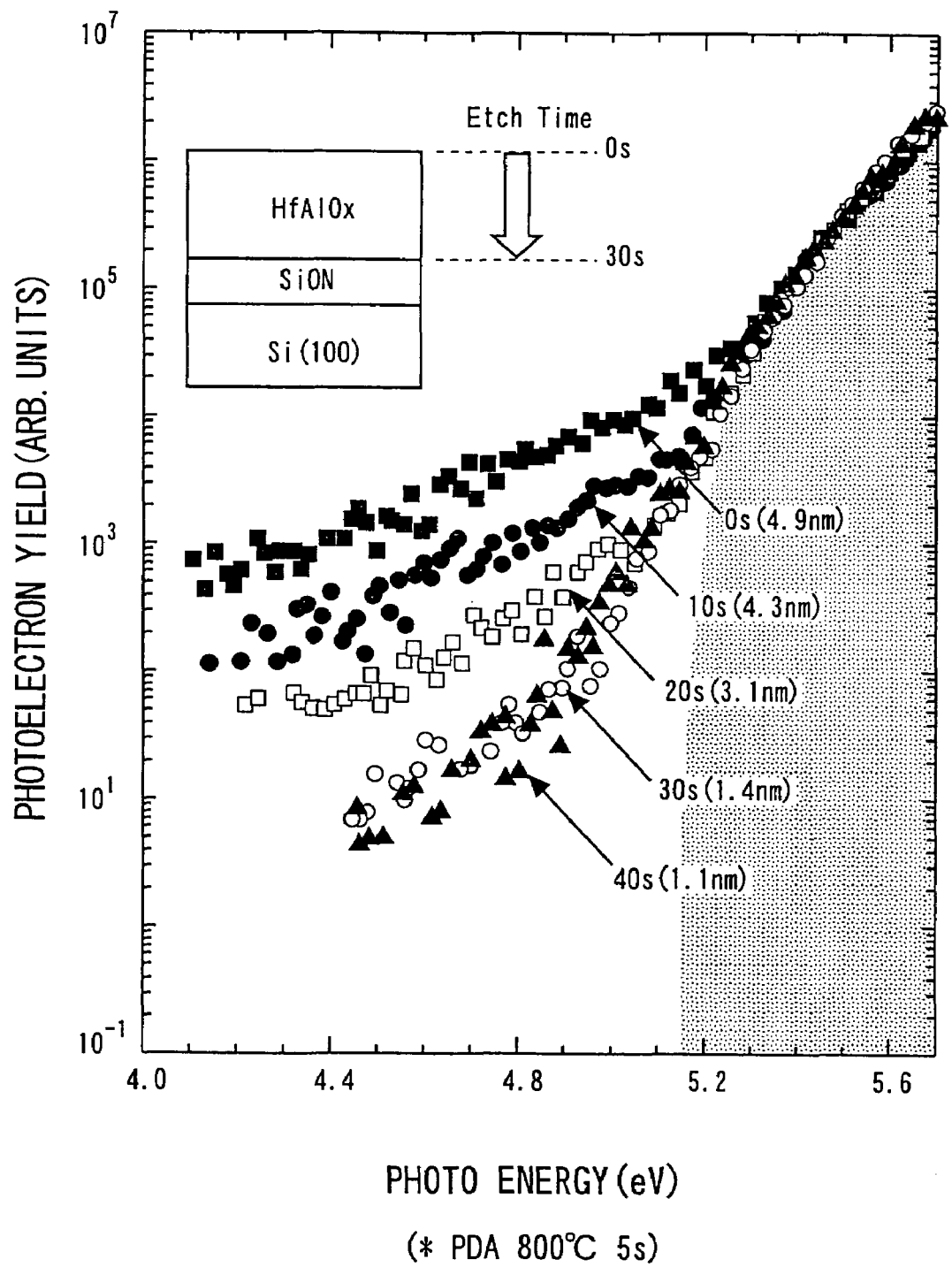
FIGS. 15A and 15B are graphs showing change in photoelectron yield against photon energy.
Figure 15B:
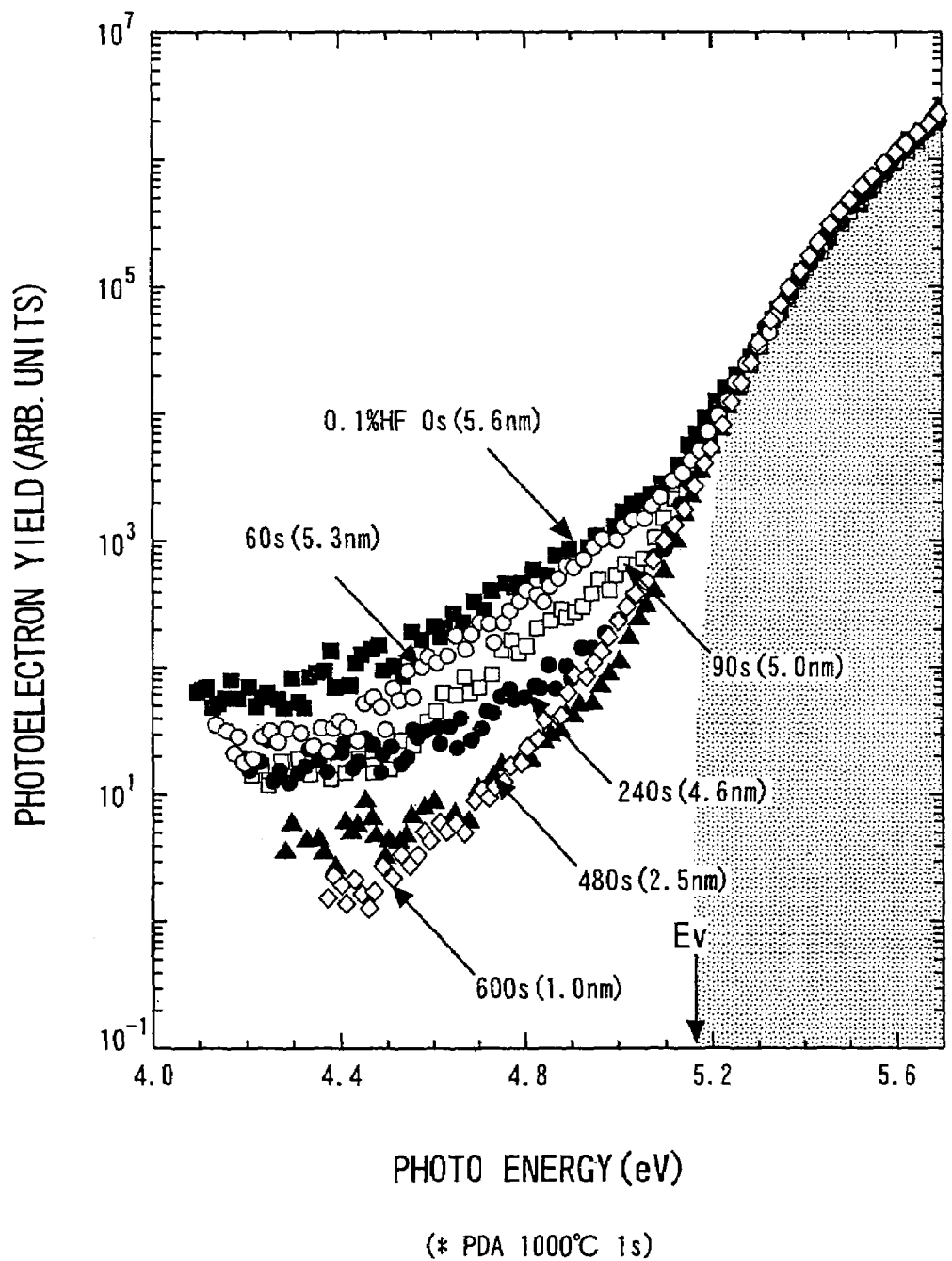

FIGS. 15A and 15B are graphs showing change in photoelectron yield against photon energy. In FIG. 15A, PDA was conducted under conditions of a temperature of 800° C. and a time of 5 seconds; in FIG. 15B, PDA was conducted under conditions of a temperature of 1000° C. and a time of 1 second. The sample, prepared by laminating a SiON film and a $HfAlO_x$ film on a silicon substrate in this order, performing PDA under the above-described conditions, and etching the $HfAlO_x$ film for different lengths of time, was measured using PYS (photoelectron yield spectrometry). Etching was performed using a 0.1% aqueous solution of hydrofluoric acid.

The photon energy at around 5.15 eV corresponds to the valence band of Si in a vacuum; and the photon energy at around 4.0 eV corresponds to the conduction band of Si. Since the photon energy between them (between 4.0 eV and 5.15 eV) corresponds to the forbidden band, there must be fundamentally no levels within this range. However, the graphs mean that when electrons are discharged from the above range, there are levels also in the forbidden band and electrons are captured thereto. In other words, the lower the photoelectron yields within a range between 4.0 eV and 5.15 eV, the less the level becomes; therefore, a favorable boundary is formed between the HfAlO$_x$ film and the SiON film. In the example of FIGS. 15A and 15B, the higher the temperature of PDA, the lower photoelectron yield within the above range.

Figure 16:
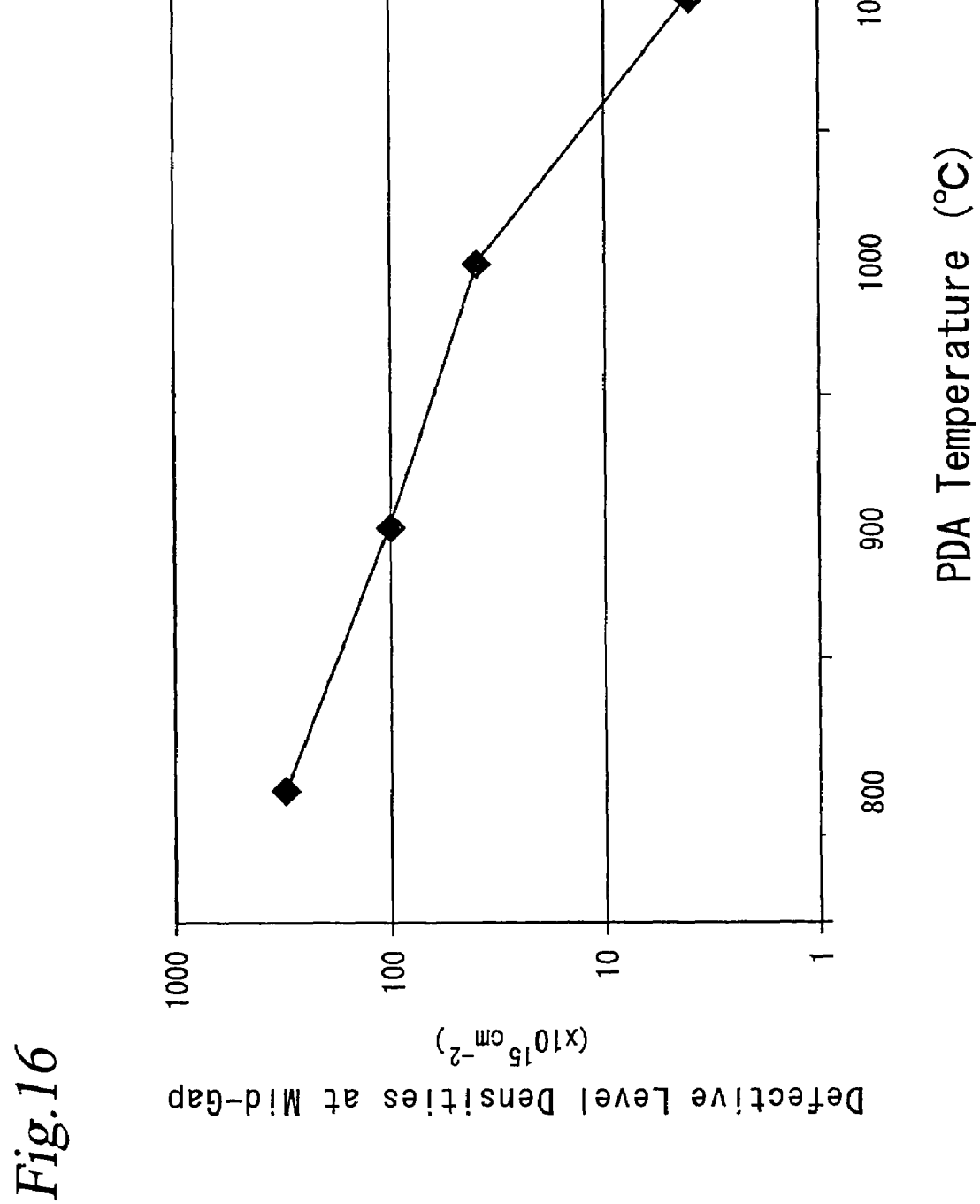
FIG. 16 is a graph showing change in defective level densities at a mid-gap against PDA temperatures.

The result of obtaining defective level densities at the mid-gap on the basis of the results in FIGS. 15A and 15B, and plotting them as the function of the PDA temperature, is shown in FIG. 16. As the PDA temperature is higher, the defective level density lowers; therefore, it is known that the boundary becomes more favorable. When the PDA temperature becomes 1050° C. The interfacial level density lowers rapidly, and the value reaches the allowable range as the device ($1\times10^{16}$ cm$^{-2}$ or less). Here, it is known from FIG. 14 that the concentrations of Si and Al in the HfAlO$_x$ film become reversed when the PDA temperature becomes 1050° C. It is also known from FIG. 13 that the concentration of Si in the HfAlO$_x$ film rises in the vicinity of the SiO$_2$ film and on the outermost surface of the HfAlO$_x$ film after PDA. Therefore, it can be said that when mutual diffusion occurs until the concentration of Si on the outermost surface of the HfAlO$_x$ film exceeds the concentration of Al, the boundary state of the HfAlO$_x$ film becomes favorable.

Figure 17A:
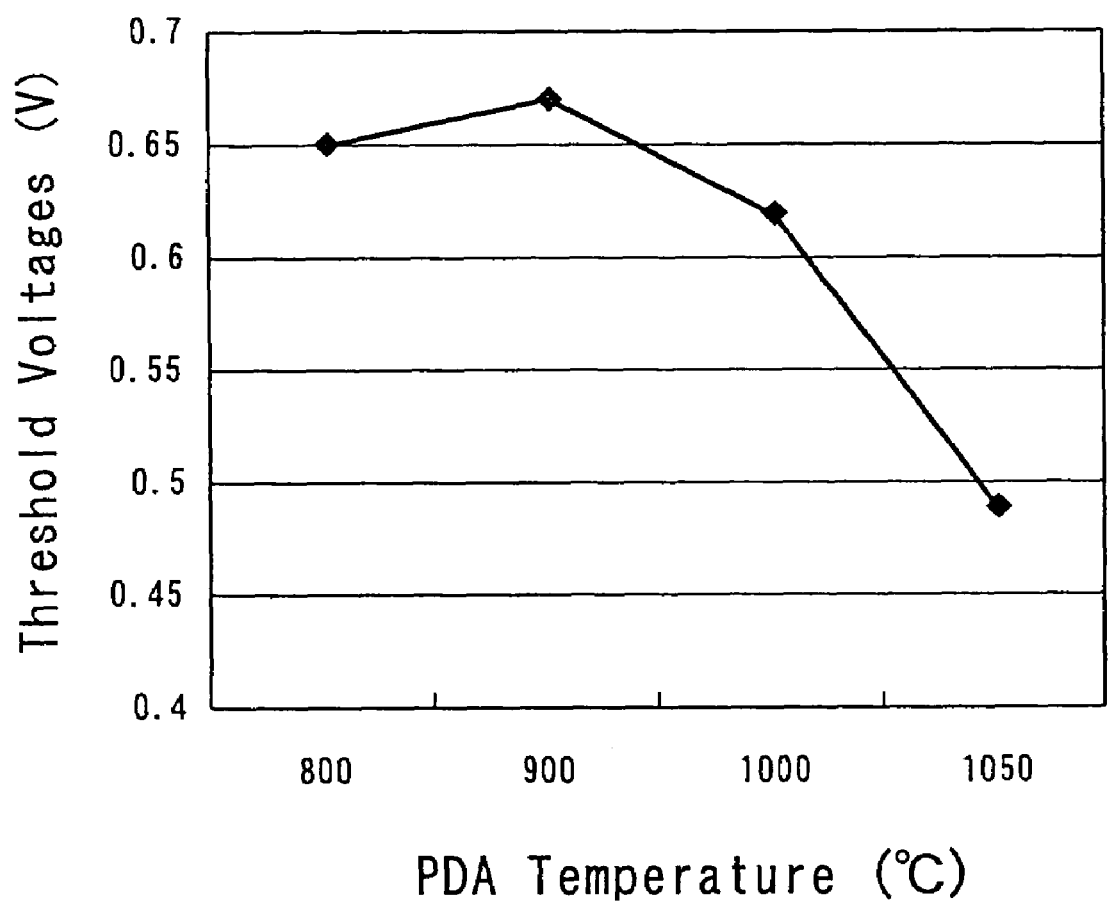
FIGS. 17A and 17B are graphs showing change in a threshold voltage against PDA temperatures.
Figure 17B:
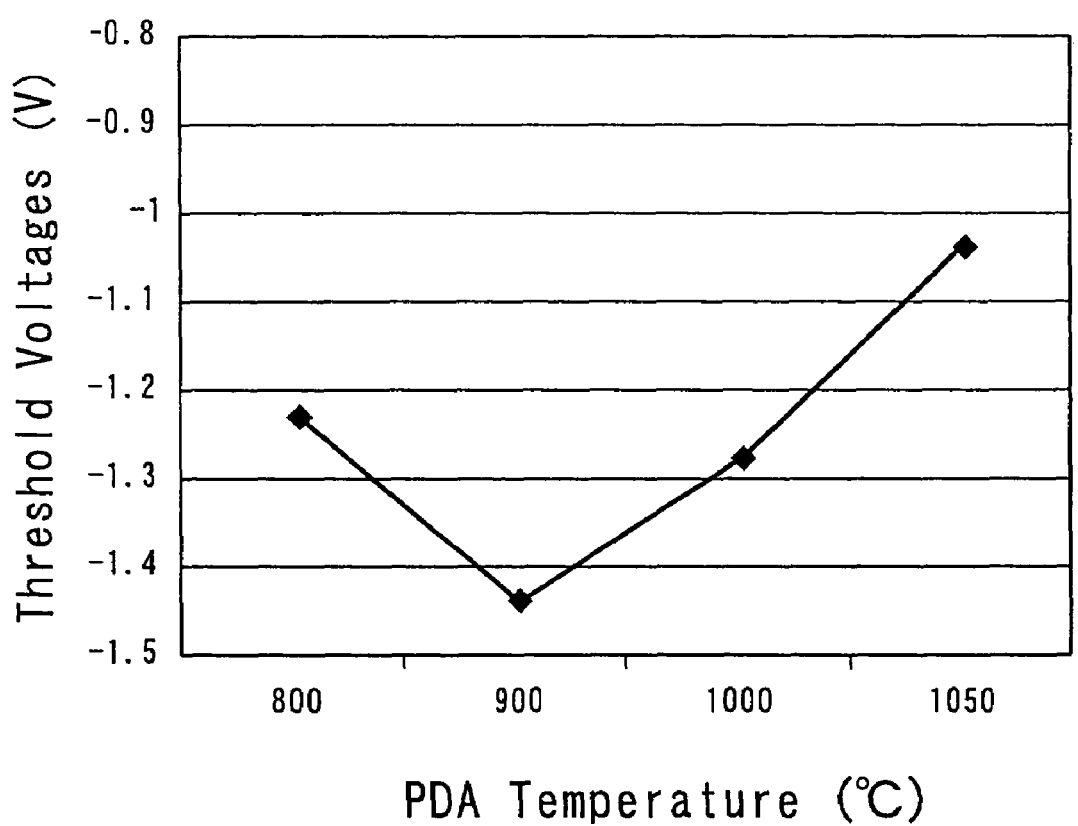

FIGS. 17A and 17B are graphs showing change in threshold voltages V$_{th}$ against PDA temperatures. FIG. 17A corresponds to an NMOS; and FIG. 17B corresponds to a PMOS. It is known from FIGS. 17A and 17B, that the absolute value of the threshold voltage lowers rapidly when the PDA temperature become 1050° C.

The features and advantages of the present invention may be summarized as follows.

According to the present invention, as described above, a semiconductor device having a small hysteresis and a thin gate insulating film can be manufactured by using a dielectric film that contains a transition metal, aluminum, silicon and oxygen as a high-dielectric-constant film.

The interfacial level density can be lowered, and the shift of Vth can be suppressed by distributing the concentration of silicon in the high-dielectric-constant film to be higher than the concentration of aluminum and the transition metal in the vicinity of the boundary with the oxide film containing silicon or the boundary with the silicon substrate, and in the vicinity of the boundary with the gate electrode, respectively.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2003-307147, filed on Aug. 29, 2003 including specification, claims, drawings and summary, on which the Convention priority of the present application is based, are incorporated herein by reference in its entirety.

The invention claimed is:

1. A semiconductor device comprising:
   a gate insulating film on a silicon substrate; and
   a gate electrode on said gate insulating film, wherein
      said gate insulating film comprises an oxide film containing silicon, and a high-dielectric-constant film on said oxide film containing silicon;
      said high-dielectric-constant film is a film containing a transition metal, aluminum, silicon, and oxygen; and
      a concentration of the silicon in said high-dielectric-constant film is larger than a concentration of the transition metal and the aluminum in said high-dielectric-constant film proximate an interface with said gate electrode.

2. The semiconductor device according to claim 1, wherein the concentration of the silicon is largest at at least one of areas proximate the interface with said oxide film containing silicon and proximate the interface with said gate electrode, gradually decreases with distance from these interfaces and becomes smallest at a central part of said high-dielectric-constant film.

3. The semiconductor device according to claim 1, wherein said oxide film containing silicon is a silicon oxide film.

4. The semiconductor device according to claim 1, wherein said high-dielectric-constant film is a film consisting of a mixture of an aluminate of the transition metal and a silicate of the transition metal.

5. The semiconductor device according to claim 1, wherein the transition metal is an element selected from Group IV elements of the periodic table.

6. The semiconductor device according to claim 1, wherein said high-dielectric-constant film is a HfAlSiO$_x$ film.

7. The semiconductor device according to claim 6, wherein the concentration of Hf, Al, and Si in said HfAlSiO$_x$ film is 25.0% to 35.0%, 32.5% to 37.5%, and 32.5% to 37.5%, respectively.

8. The semiconductor device according to claim 1, wherein said gate electrode is polysilicon.

9. A semiconductor device comprising:
   a gate insulating film on a silicon substrate; and
   a gate electrode on said gate insulating film, wherein
      said gate insulating film is a high-dielectric-constant film containing a transition metal, aluminum, silicon, and oxygen; and
      a concentration of the silicon in said gate insulating film is larger than a concentration of the transition metal and the aluminum in said high-dielectric-constant film proximate an interface with said gate electrode.

10. The semiconductor device according to claim 9, wherein the concentration of the silicon is largest at at least one of areas proximate the interface with said silicon substrate and proximate the interface with said gate electrode, gradually decreases with distance from these interfaces, and becomes smallest at a central part of said high-dielectric-constant film.

11. The semiconductor device according to claim 9, wherein said high-dielectric-constant film is a film consisting of a mixture of an aluminate of the transition metal and a silicate of the transition metal.

12. The semiconductor device according to claim 9, wherein the transition metal is an element selected from Group IV elements of the periodic table.

13. The semiconductor device according to claim 9, wherein said high-dielectric-constant film is a HfAlSiO$_x$ film.

14. The semiconductor device according to claim 13, wherein the concentration of Hf, Al, and Si in said $HfAlSiO_x$ film is 25.0% to 35.0%, 32.5% to 37.5%, and 32.5% to 37.5%, respectively.

15. The semiconductor device according to claim 9, wherein said gate electrode is polysilicon.

* * * * *